US012412223B2

(12) United States Patent
Hudelson et al.

(10) Patent No.: US 12,412,223 B2
(45) Date of Patent: Sep. 9, 2025

(54) TWO-DIMENSIONAL INTERACTIVE CONSTRUCTION DRAWINGS

(71) Applicant: Inertia Systems, Chula Vista, CA (US)

(72) Inventors: Matthew Hudelson, San Diego, CA (US); Veljko Petrovic, San Diego, CA (US)

(73) Assignee: Inertia Systems, Chula Vista, CA (US)

( * ) Notice: Subject to any disclaimer, the term of this patent is extended or adjusted under 35 U.S.C. 154(b) by 1011 days.

(21) Appl. No.: 17/601,022

(22) PCT Filed: Apr. 3, 2020

(86) PCT No.: PCT/US2020/026750
§ 371 (c)(1),
(2) Date: Oct. 1, 2021

(87) PCT Pub. No.: WO2020/206378
PCT Pub. Date: Oct. 8, 2020

(65) Prior Publication Data
US 2022/0156857 A1    May 19, 2022

Related U.S. Application Data

(60) Provisional application No. 62/828,934, filed on Apr. 3, 2019.

(51) Int. Cl.
*G06F 30/13* (2020.01)
*G06Q 50/08* (2012.01)

(52) U.S. Cl.
CPC ............ *G06Q 50/08* (2013.01); *G06F 30/13* (2020.01)

(58) Field of Classification Search
CPC ... G06Q 50/08; G06Q 10/06312; G06F 30/13
USPC .......................................................... 703/2
See application file for complete search history.

(56) References Cited

U.S. PATENT DOCUMENTS

| | | | |
|---|---|---|---|
| 9,891,791 B1* | 2/2018 | Khan | G06T 17/20 |
| 10,372,839 B2* | 8/2019 | Lavrov | H04L 67/75 |
| 2002/0016725 A1 | 2/2002 | Eichstaedt | |
| 2012/0310602 A1 | 12/2012 | Jacobi | |
| 2013/0339078 A1 | 12/2013 | Harris | |
| 2015/0089344 A1* | 3/2015 | Pickering | G06F 16/21 715/215 |

OTHER PUBLICATIONS

Daneil Zibion, "Development of a BIM-enabled Software Tool for Facility Management using Interactive Floor Plans, Graph-based Data Management and Granular Information Retrieval" (Year: 2018).*

Resty Gonzales Garcia, "The impact of digilization on Property Operations and Maintenance (O&M)" (Year: 2017).*

(Continued)

*Primary Examiner* — John E Johansen
(74) *Attorney, Agent, or Firm* — MORRISON & FOERSTER LLP

(57) ABSTRACT

In some embodiments, a construction management method includes providing, at a central computer, a plurality of interactive 2-D construction drawings, each drawing including a respective affordance of a digital construction entity, where the respective affordances include different 2-D perspectives of the digital construction entity.

17 Claims, 11 Drawing Sheets

(56) References Cited

OTHER PUBLICATIONS

Sofia Agostinelli, "5D BIM: Tools and Methods for Digital Project Construction Management" (Year: 2019).*
Kiu Mee San, "The Potentials and Impacts of Blockchain Technology in Construction Industry: A Literature Review"(Year: 2019).*
Cospec Innolab, "KBIM D Generator IFC," Youtube (Mar. 28, 2016), Retrieved from the Internet on Jul. 16, 2020 at: https://www.youtube.com/watch?v=uBIC1bAQMjg, the whole document.
International Preliminary Report on Patentability and Written Opinion mailed Oct. 14, 2021, for PCT Application No. PCT/US2020/026750, filed Apr. 3, 2020, nine pages.
Canadian Office Action dated Mar. 17, 2025, for CA Patent Application No. 3,135,626, four pages.
Australian Office Action dated Dec. 6, 2024, for AU Patent Application No. 2020253564, three pages.

* cited by examiner

TWO-DIMENSIONAL INTERACTIVE CONSTRUCTION DRAWINGS

CROSS REFERENCE TO RELATED APPLICATIONS

This application is a national stage application under 35 U.S.C. § 371 of International Application No. PCT/US2020/026750, filed internationally on Apr. 3, 2020, which claims the benefit of U.S. Provisional Application No. 62/828,934, filed on Apr. 3, 2019, the entire disclosures of which are incorporated herein by reference for all purposes.

BACKGROUND

This disclosure relates to construction management. More specifically, this relates to a plurality of interconnected and interactive two dimensional (2-D) construction drawings that facilitate field generated data entry throughout a building's lifecycle.

Building information modelling (BIM) includes a digital representation of a physical structure, typically a three-dimensional model (3-D) of the existing or future structure. The 3-D model can depict all or a selected set of the physical aspects, structures, openings, and components of a building. The 3-D model advantageously allows designers to view building components from different perspectives (e.g., views and layers) and to include/exclude specific components to facilitate desired views.

Further, BIM is widely used by designers in the architectural, engineering, and construction industries because, in part, a BIM representation can include specifications and data about objects in the model. For example, a BIM model can include a three-dimensional representation of a door and also include that door's size, weight, and manufacturer. Designers can interact with the objects in the model, centrally store data, and access data about those objects.

BIM has much potential, promising data driven management of a construction project's lifecycle, from initial structural design through handoff and facility management. But BIM has largely failed to deliver on this promise because of barriers to adoption by those in the field. A primary barrier is BIM's incompatibility with field use and the preferences of field users. Although trained architects and engineers are comfortable navigating and manipulating BIM's 3-D models, most field users are not. Stake holders at a construction site are typically trained and experienced in hard-copy 2-D construction drawings. Building inspectors, for example, typically use 2-D construction drawings to understand a structure and navigate a field inspection. Field users have neither the time nor interest to increase their comfort level in the 3-D space. Further, team members at construction sites are limited to accessing BIM models through smaller portable options, such as tablets and cellular phones, where 3-D models become difficult to navigate and manipulate. Known solutions to bringing BIM's 3-D environment to field use include converting a 3-D model into 2-D drawings (for example, a 2-D portable document format file, commonly referred to as "pdf"). Unfortunately, the 3-D to 2-D conversion loses BIM's object data, typically producing static drawings that are merely electronic equivalents of the traditional hard copy 2-D construction drawings. When information is added to the electronic 2-D construction drawings, the detail is added manually and is at a low-level (partly due to the time, cost, and error-rate of manually entering detail to a pdf). Further, the added detail is disconnected from BIM object identification and thus loses its connection to the underlying 3-D BIM model.

Moreover, BIM has largely failed to integrate itself into construction projects' lifecycle. Realization of BIM's potential requires field users to add their data to the model, including data on progress and/or completion of field actions. But field users have other priorities, and the data is, at best, delayed and frequently lost. The traditional solution to integrating field data into BIM is an error-prone procedure: the field user must make a record (hard-copy or local electronic copy) of their action, remember to send (e.g., a competed work order in hard-copy, an e-mail, etc.) the record to the right person, and then trust that person will update the BIM promptly and accurately. Too often, the data isn't captured and too often data upload is delayed, leading to inspection fails, schedule delays, and budget overruns.

BRIEF SUMMARY

Embodiments herein advantageously link 3-D information models' advantages with the 2-D field environment. In some embodiments, a construction management method includes providing, at a central computer, a plurality of interactive 2-D construction drawings, each drawing including a respective affordance of a digital construction entity, where the respective affordances include different 2-D perspectives of the digital construction entity. The interactive 2-D construction drawing also includes an identifier for the digital construction entity, where the identifier is electronically associated with the respective affordance. Advantageously, the disclosed interactive 2-D construction drawings allow field users to navigate in a familiar 2-D drawing environment while also allowing interaction with the drawing (as in a 3-D information model, such as BIM). Further, by electronically associating the entity identifier with the affordance, the field users can actuate a visual representation of the construction entity and obtain information associated with the entity identifier. The digital construction entity's identifier allows access to the entity's records, which can include field generated action data. Embodiments herein thereby allow field users to retrieve field generated action data by manipulating a 2-D interactive construction drawing, facilitating access to BIM (or other information model) data while in the field.

In some embodiments herein, a method: receives, from a remote computer, a request for one of the plurality of interactive 2-D construction drawings; provides, to the remote computer, the requested interactive 2-D construction drawing; displays, on the remote computer, the requested interactive 2-D construction drawing; and receives a selection of the respective affordance of the requested interactive 2-D construction drawing.

Embodiments herein advantageously provide for a centralized management of a digital construction entity record, facilitating real-time updating throughout a plurality of interconnected, interactive 2-D construction drawings. In some embodiments, a method includes: retrieving, in response to the selection of the affordance, a field action item from the record and displaying, on the remote computer, the field action item with the requested interactive 2-D construction drawing; receiving, at the remote computer, field generated action data; and updating the field action item in the entity record based on the field generated action data. Advantageously, a field user can interact with embodiments of 2-D construction drawings' disclosed herein while performing a field action on a building component, the field worker can interact with the digital construction entity corresponding to the building component, and update the field action item during performance of the field action. The data associated with the field action can then be incorporated into the entity record, updating in real-time the digital record of the construction object. Advantageously, that updated digital record can be immediately available for other field users and team members. In some embodiments, a method includes: receiving a request, from a second remote computer, for a different one of the plurality of interactive 2-D construction drawings; providing, to the second remote computer, the second requested interactive 2-D construction drawing; receiving, from the second remote computer, a selection of the respective affordance of the second requested interactive 2-D construction drawing; and, in response to receiving the selection of the respective affordance of the second requested interactive 2-D construction drawing, retrieving the updated field action item from the entity record and displaying, on the second remote computer, the updated field action item with the requested interactive 2-D construction drawing.

In some embodiments, the entity record includes data of previously updated field action items for the digital construction entity. In this way, embodiments of the interactive 2-D construction drawings disclosed herein allow a field worker to access a field history of a building component in real-time.

In some embodiments herein, the methods advantageously integrate field actions into a construction project's schedule and budget. For example, some methods disclosed herein include cost and schedule information in the entity record or elsewhere in a construction management system. When a field user updates a field action item, the update to the entity record can include updating the cost and schedule information (which includes, in some embodiments, determining the effect of the field action item update on the cost and schedule of the project), which then can be promulgated to the larger project workflow. Notifications can be sent when a field action item is inconsistent with a cost or schedule parameter, such as when a field action update causes a cost parameter and/or a schedule parameter to exceed a predefined threshold.

In some embodiments, the entity record includes 3-D position data of the digital construction entity. In some embodiments, the 3-D position data can be used as an entity identifier, or in conjunction with an entity identifier. In some interactive 2-D construction drawings, an affordance of one object may obscure another. For example, wall rendering in 2-D covers any pipes inside the wall. With 3-D position data of each object, the system can advantageously identify the intersection of two objects, even if one of those objects is not displayed on an interactive 2-D construction drawing. In other embodiments, a free floating pipe (e.g., on an interactive 2-D construction drawing of a plumbing system that does not display other components) can be identified with an associated wall by examining the intersect of the pipe's 3-D position data with other objects (which will, in this instance, include the associated wall).

In some embodiments, updating the entity record includes updating the entity record on the central computer. In some embodiments, updating the entity record includes updating a local copy of the entity record on the remote computer and the second remote computer. In some embodiments, a method includes: determining that another of the interactive 2-D construction drawings includes an affordance associated with the digital construction entity; providing, to a second remote computer, the updated field action item, where the second remote computer locally stores the other of the interactive 2-D construction drawings; and updating a local entity record, stored on the second remote computer, to include the updated field action item.

In some embodiments, a method includes: providing a 3-D construction model including the digital construction entity; receiving a plurality of viewpoints of the digital construction entity, each corresponding to a respective one of the plurality of 2-D perspectives of the digital construction entity; identifying a plurality of perspectives of the 3-D construction model, each including a respective one of the plurality of 2-D perspectives of the digital construction entity; preparing the plurality of interactive 2-D construction drawings based on the plurality of perspectives of the 3-D construction model; and transmitting the plurality of interactive 2-D construction drawings. In some embodiments, a method includes: identifying a border of the digital construction entity for the respective viewpoint; identifying an area of the digital construction entity for the respective viewpoint based on the identified border; identifying the affordance of the digital construction entity based on the identified area; and associating the entity identifier with the affordance. In some further embodiments, the area of the digital construction entity is subdivided based in part on the relative positions of other digital construction entities.

In some embodiments, a method includes authenticating the interactive 2-D construction drawing with a blockchain technology. By timestamping and locking the 3-D model, embodiments herein may advantageously validate versions of interactive 2-D. The locked 3-D model is used to generate the interactive 2-D construction drawings and authenticate those drawings based on the validated 3-D model.

In some embodiments, an electronic device includes: a processor; memory; and a program, wherein the program is stored in the memory and configured to be executed by the processor, the program comprising instructions for performing any of the methods described herein.

DETAILED DESCRIPTION

Figure 1A:
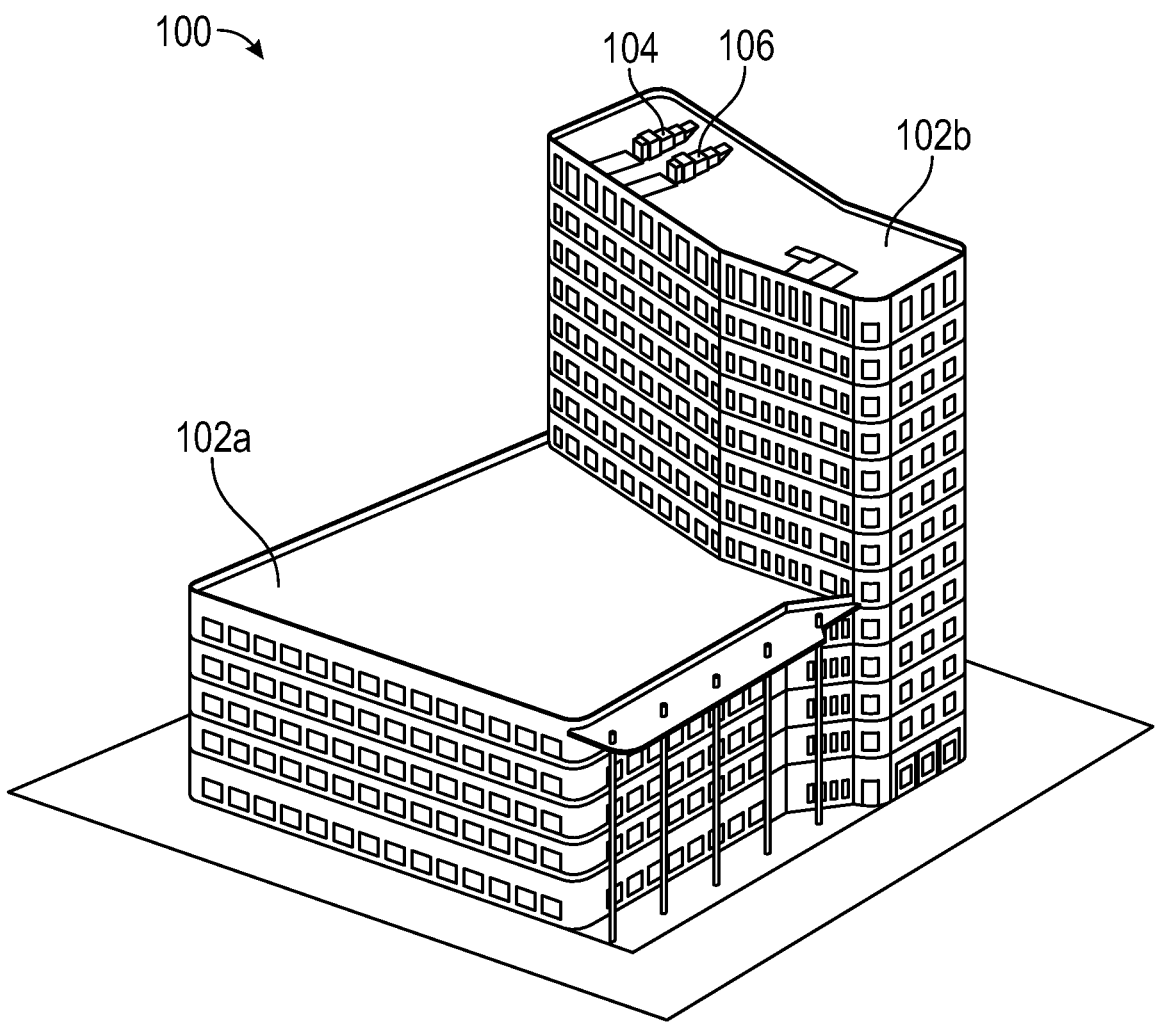
FIG. 1A depicts an exemplary 3-D model of a structure.

Embodiments herein advantageously link 3-D information models' advantages with 2-D construction drawings. Further, the disclosed interactive 2-D construction drawings allow field users to navigate in a familiar 2-D construction drawing while also allowing interaction with the drawing (as in a 3-D information model). Further, field users can actuate a visual representation of a construction entity and obtain associated information. Embodiments herein allow field users to retrieve field generated action data by manipulating a 2-D interactive construction drawing, facilitating access to BIM (for example) data while in the field. Embodiments herein allow field users to transmit field generated action data when performing a field action using an interface on a remote computer. This addresses the need for the end-user to record data, report it, and then trust other team members to properly input the data.

FIG. 1A depicts an exemplary 3-D model 100 of a building. In FIG. 1A, all components are fully rendered, including all exterior walls and windows. Model 100 could represent a planned structure in a construction project (for example, construction of a new hospital or hotel) or an existing structure. Model 100 includes two main sections, a tower base 102a and a tower 102b. Tower 102b includes a HVAC system, with air handler units 104 and 106 visible in the perspective of FIG. 1A.

Figure 1B:
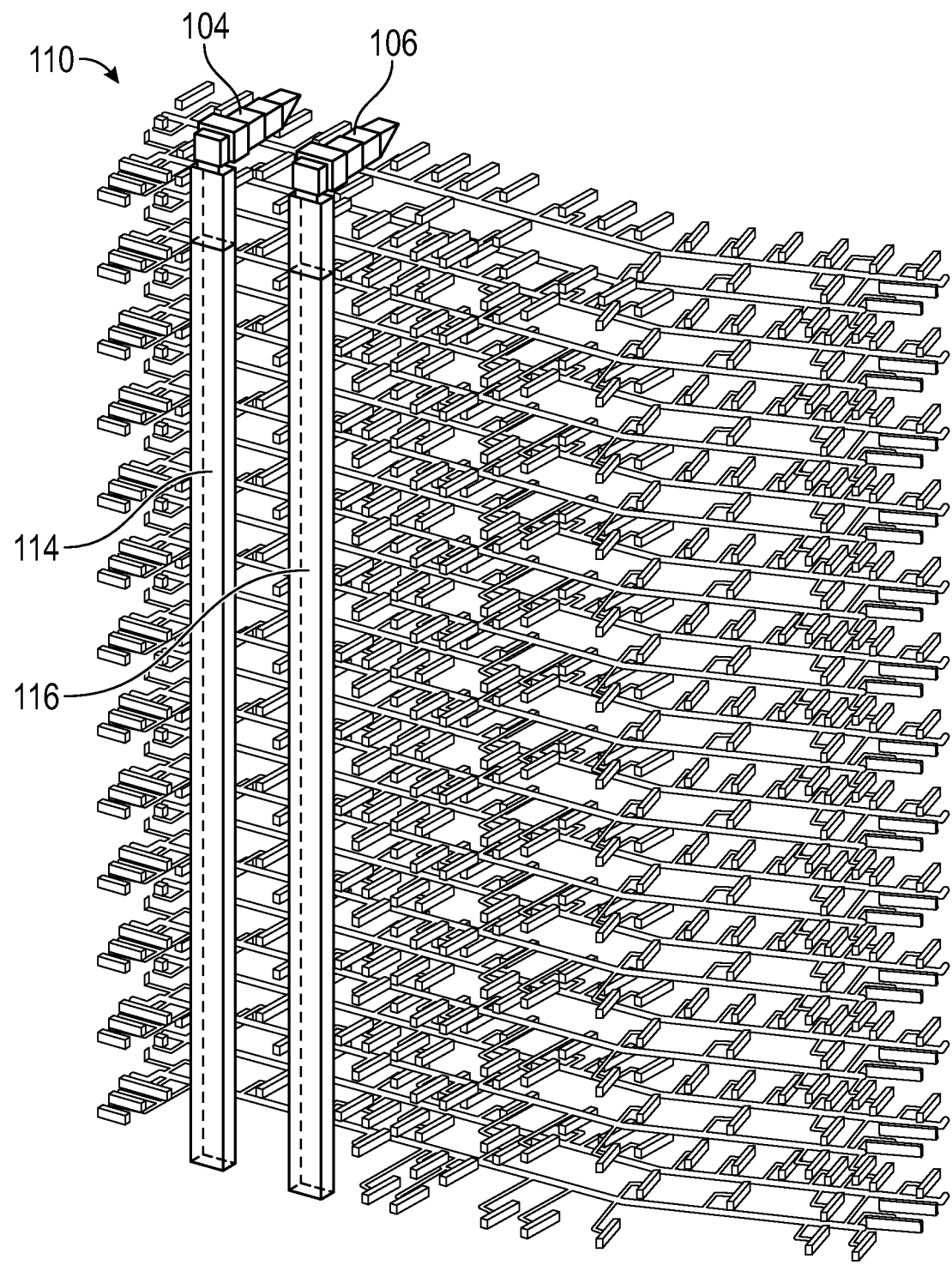
FIG. 1B depicts a different perspective of the 3-D model of FIG. 1A.

FIG. 1B depicts perspective 110 of model 100. In perspective 110 most components are removed to allow the viewer to freely inspect the HVAC components. Thus, the exterior walls and windows, for example, are removed in perspective 100. Perspective 100 includes air handler units 104 and 106 with exhaust air ducts 114 and 116, respectively. Other HVAC components (not labelled) are also depicted.

In model 100, the rendered components are interactive. A user can select one of the rendered objects and obtain further information on the object. In FIG. 1B, a user has selected components 104, 106, 114, and 116 and can obtain BIM data (or other 3-D information model data) on the components. This allows the user to not only receive visual information on the objects, but also other data related to the object, like specifications, manufacturer information, etc. Such features are lost when the 3-D model is adapted to 2-D construction drawings in traditional approaches to field use for 3-D models.

Figure 2A:
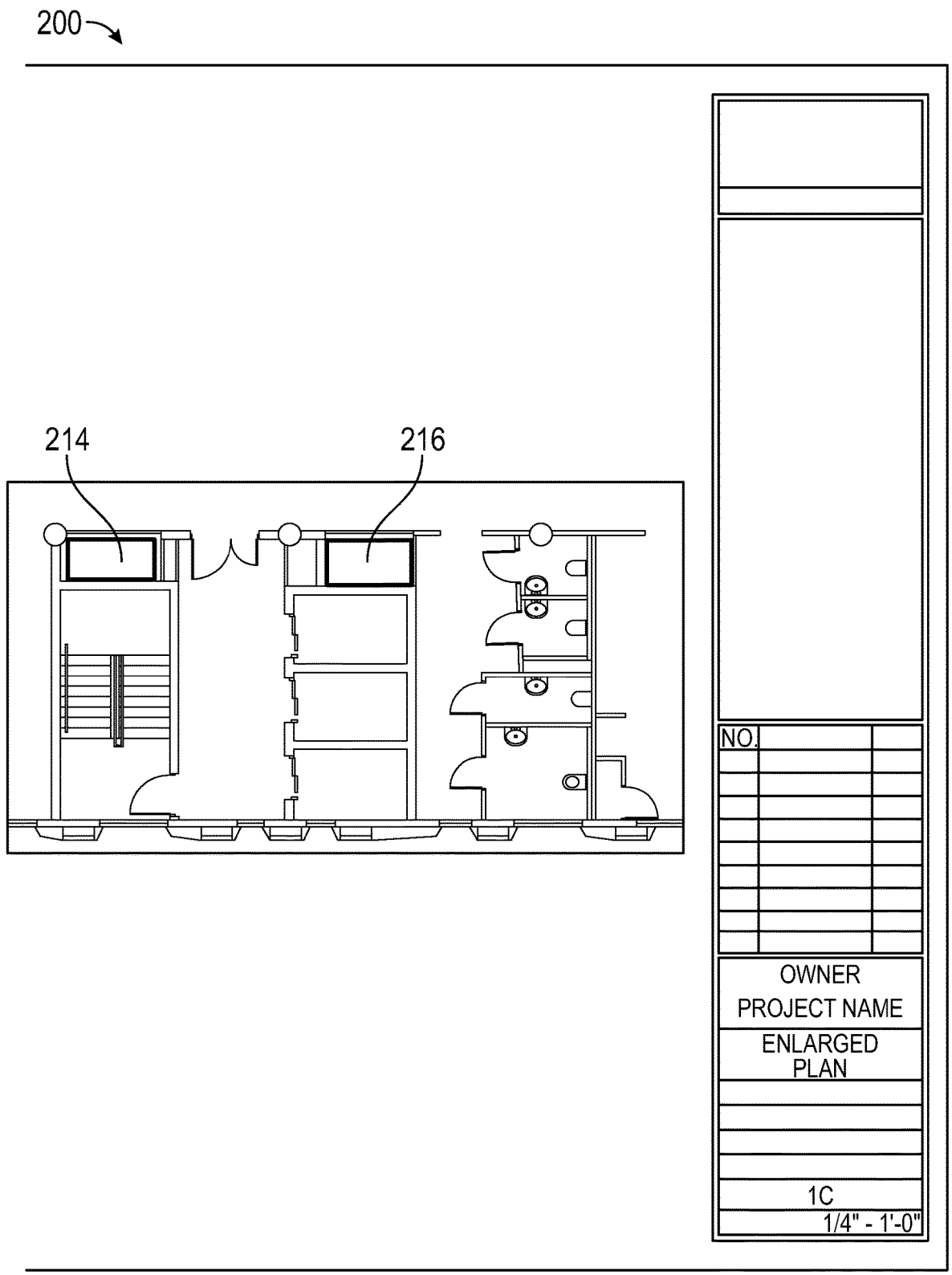
FIG. 2A depicts an exemplary interactive 2-D construction drawing.

FIG. 2A depicts an exemplary interactive 2-D construction drawing 200. Drawing 200 may be a plan view perspective taken through a portion of a floor of tower 102b in model 100. The plan view includes renderings of building objects associated with digital construction entities, including affordance 214 of shaft 114 of model 100 and affordance 216 of shaft 116 of model 100.

As used herein, an "interactive 2-D construction drawing" includes construction blueprints in digital form on which construction of a project and/or permitting for the construction of the project may proceed. An interactive 2-D construction drawing includes a plurality of digital construction entities. As used herein, a digital construction entity includes a digital representation of a (planned or existing) physical building component. For example, affordances 214 and 216 are associated with respective digital construction entities. The digital construction entity includes an entity identifier and an entity record. In some embodiments, the entity identifier is a BIM identification, such as a UUID (universally unique identification), to identify each object in an associated BIM model. In some embodiments, other identifier systems are used.

In some embodiments, an entity record can include field action items which can be updated based on field generated action data. As used herein, field generated action data includes data on activities performed (or scheduled for performance) at a physical structure or a construction site for a planned structure. Field actions can include inspection activities (RFIs, ROIs, inspection tracking, etc.), quality control, project photography and video, punch-list information, submittals inspection information, field issue information, field observation information, among other types of information. Field generated action data includes data that results from field actions. A field action item includes a record of a performed or scheduled-to-be-performed field action. Field action items may include inspections, building (e.g., framing, dry wall), repair, maintenance, painting, plumbing, electrical work, or any activity related to the construction of a building that is performed at the building or related to an existing building that is performed at the building. In some embodiments, a field action item includes divided authorization for completion (for example, a field action item could include a completed work-order action, a quality review action by another team member, and an approval action by a supervisor).

In some embodiments, the field generated action data and/or field action item is accessible through the interactive 2-D construction drawing by actuating the associated affordance. Advantageously, the disclosed interactive 2-D construction drawings allow field users to navigate in a familiar 2-D construction drawing environment while also allowing interaction with the drawing as in a BIM model and obtaining information about the objects in the model. Further, by linking the interactive 2-D construction drawing to a 3-D information model, the interactive 2-D construction drawing can provide high level detail (in contrast to low-level detail provided by, e.g., pdf).

As used herein, an affordance includes an actuatable indicia or element within or on a model or drawing and a representation thereof. For example, an affordance could include a depiction of a wall, boundary, window, door, conduit, pipe, shape, line, spot, position, etc., among a variety of additional visually depicted or locatable indicia or element within or on a model or drawing, or representation thereof. When included in an interactive 2-D construction drawing, an affordance is actuatable to obtain additional information about or related to a corresponding digital construction entity rendered on the drawing. This interaction provides the ability to access or embed information about or related to the digital construction entity, or planned, current or past construction associated with the entity identification. This information can then be accessed or updated upon selecting an affordance in the interaction 2-D construction drawing environment.

In some embodiments, the interactive 2-D construction drawing is prepared using a language that provides searching, indexing, and scripting of images (for example, Scalable Vector Graphics, commonly called SVG). In some examples, the interactive 2-D construction drawing is provided in a vector image format for two-dimensional graphics with support for interactivity and animation. The format includes the ability to store entity identifiers, polyline points, and object sheets. The drawings can be high resolution, fast loading, and contain objects linked to the entity identifier, can contain dynamically linked callouts, and link contained objects to a list comprising all of the interactive 2-D construction drawings for a specific 3-D model. In some embodiments, a digital construction entity's identifier is embedded in metadata in the interactive 2-D construction drawing and associated with an affordance of the digital construction entity. Similarly, the digital construction entity's record can be embedded in metadata in the interactive 2-D construction drawing and associated with an affordance of the digital construction entity. In some embodiments, the interactive 2-D construction drawing is not a layered pdf.

Figure 3:
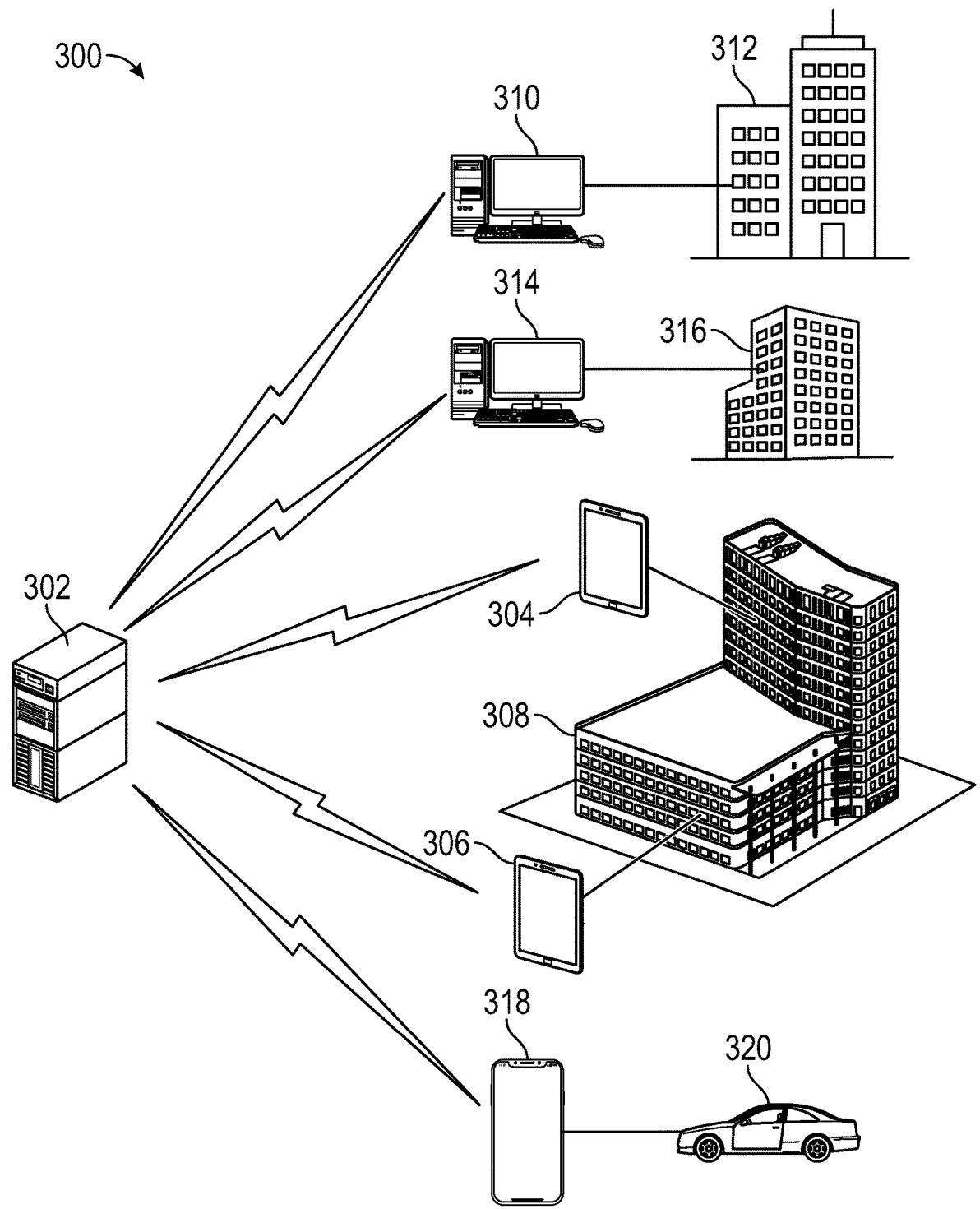
FIG. 3 depicts an exemplary construction management system.

Briefly turning to FIG. 3, depicted there is an exemplary construction management system 300. Construction management system 300 includes a central server 302 (also a computer) and remote computers 304, 306, 310, 314, and 318. The remote computers can be located at physical structure 308, but could be elsewhere. For example, remote computer 310 is located at an architect and engineering firm 312, remote computer 314 is located at a contractor's office 316, and remote computer 318 is located with an owner 320 of the property 308.

In some embodiments, central server 302 provides multiple interactive 2-D construction drawings (such as drawings 200 and 400 described herein) to various stakeholders. Each interactive 2-D construction drawing includes at least one entity identifier and respective affordance corresponding to a digital construction entity. Different drawings offer different 2-D perspectives of the 3-D model and include different affordances corresponding to different 2-D perspectives of the digital construction entity.

In some embodiments, the record entity is stored at central server 302. In some embodiments, central server maintains real-time connections (e.g., WiFi, cellular, etc.) with the remote computers. When a field user of remote computer 304 or 306 adds field generated action data, the data can be transmitted in real-time to the central server so that the field action item in the record entity is updated in real-time. This addresses the need for the end-user to record data, report it, and then trust other team members to properly input the data. In addition, real-time updates allow every stakeholder in the system to have the most up-to-date data. Further, the field user can provide the field generated action data when performing the field action using an interface on the remote computer. This advantageously addresses BIM's failure to engage field users into providing construction information to efficiently update the system. By providing this data, the construction management methods described herein can be reliable data driven projects because the management team are assured that field users are updating the data promptly and thus the data in the system is both accurate and current. Embodiments herein thus provide for predictive, leading indicators in real time (as opposed to traditional approaches which rely on disconnected and lagging indicators). By providing real-time interconnected data, construction management methods herein reduce stoppages, delays, rework, and waste.

As used herein, "real-time" includes connecting directly over a wireless connection. Real-time may not be instantaneous and can include processing and/or telecommunication lags and/or intentional delays or jitter in a transmission.

In some embodiments, an entity record is stored on a local file on a remote computer, such as remote computers 304, 306, 310, 314, and 316. This arrangement may be advantageous where, for example, a remote computer will lose its connection to central server 302 when at the site. In such instances, the field action item on the local entity record is updated on the local computer based on the field generated action data, the updated field action item is later transmitted to the central server 302 when the remote computer is re-connected to the central server 302, and then the entity record is updated to include the updated field generated action data. As will be understood, updating a field action item on the local entity record based on the field generated action data includes a remote computer receiving the field generated action data and updating the field action item in the local record and/or a remote computer receiving an updated field action item and updating the field action item in the local record.

As will be readily understood by those skilled in the art, updates to the entity record are not limited to field use and are not limited to the interactive 2-D construction drawings. Every stake holder, team member, module, and phase of a project can update an entity record, advantageously allowing field users and all team members to have real-time information available when field actions are performed. Further, the entity record is not limited to field generated action data, but can also include schedule and cost data, as described further herein. Further, the entity record can include system information, sub system information, manufacturer information, model information, equipment specifications, physical specifications, design specifications, contractor or subcontractor information, geographical information, environmental information, seismic or geologic information, among other types of information.

Returning to FIG. 2A, drawing 200 may be transmitted to a remote computer (such as remote computers 304, 306, 310, 314, and 316) after a central computer (such as central server 302) receives, from the remote computer, a request for one of the plurality of interactive 2-D construction drawings. As will be appreciated, the remote computer requesting (and the central computer transmitting) one interactive 2-D construction drawing encompasses the request/transmission of more than one interactive 2-D construction drawing. Once received at the remote computer (such as remote computer 304, 306, 310, 314, or 316), drawing 200 displays, on the remote computer, the requested interactive 2-D construction drawing.

Figure 2B:
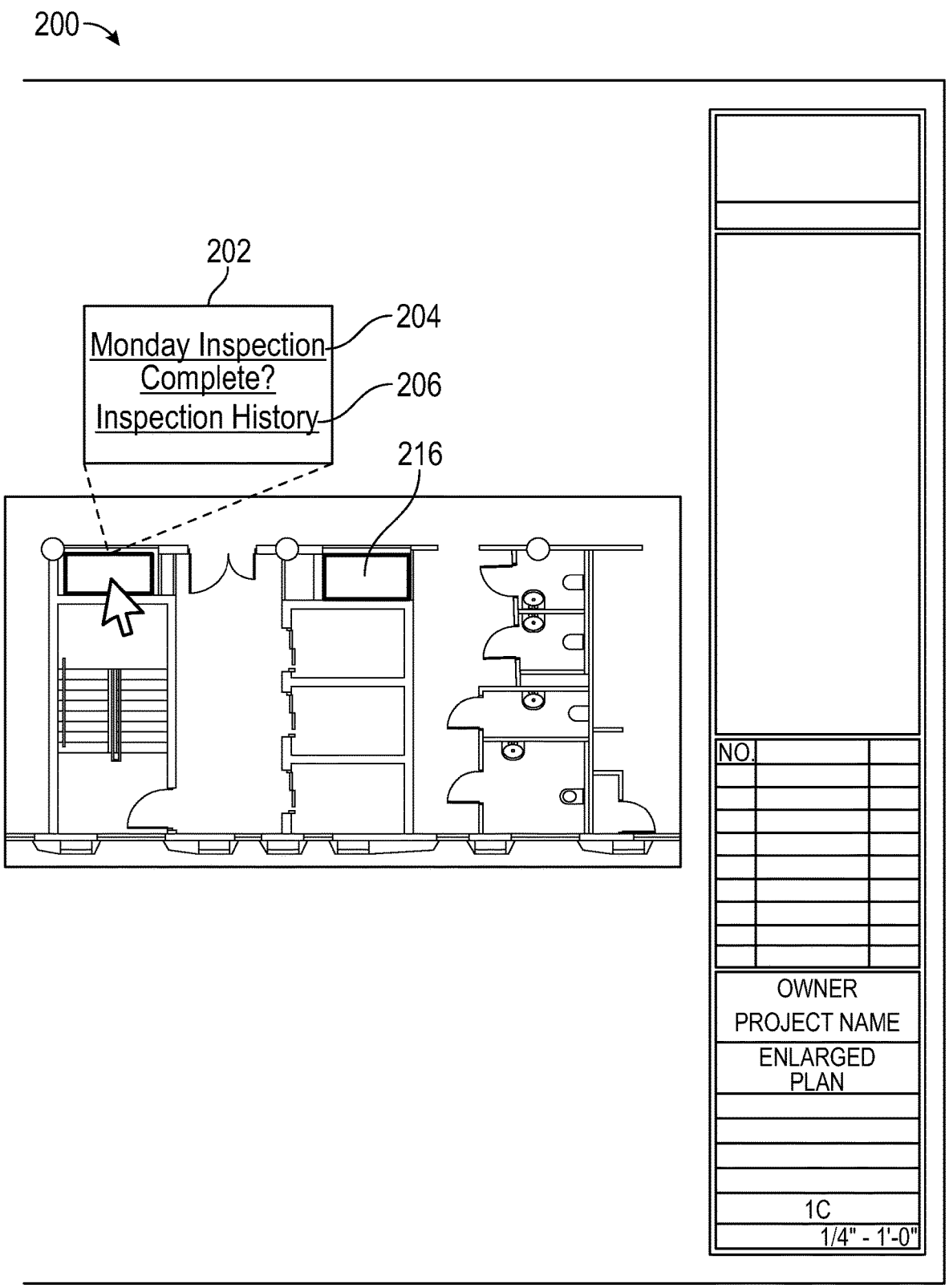
FIG. 2B depicts an exemplary interactive 2-D construction drawing.

FIG. 2B depicts interactive 2-D construction drawing 200 after a user has selected affordance 214 associated with the exhaust air duct. The selection of the affordance could be received and processed locally (e.g., at one of the remote computers) or received or processed at the central computer. In response to receiving the selection of affordance 214, a computer (a remote or central computer) identifies the entity identifier of digital construction entity and retrieves construction data from the entity record. The construction data is then displayed in interface 202.

In the embodiment of FIG. 2B, field action item is retrieved and displayed in interface 202. In this case, the field action item includes a confirmation request 204 that a scheduled inspection has been completed. The interface also includes an option to access the inspection history 206 of the digital construction object. By providing real-time access to previously updated field action items, a field user can obtain additional information on the field action at hand. The field user may not be aware of a need for historical data until performing the field action. For example, an inspector may not determine that he wants to review a prior inspection report before passing the current inspection, but only appreciates the need for the historical data until on-site at the time of inspection (for example, a dry-wall inspector may want to review a prior plumbing inspection to determine the position of framing within a wall and review the framing inspection for additional information).

As will be understood by those in the art, user interface 202 is exemplary and other interfaces could be used without deviating from the scope of this disclosure. User interface provides an example of location-focused record management. The information in the user interface is directly linked to the location, a location of matching type, or a record entity. The user interface can include different record types authored by different team members during different phases of construction that all relate to the location/object selected. All this information is available to the field user by selecting the corresponding affordance on the interactive 2-D drawing.

Figure 2C:
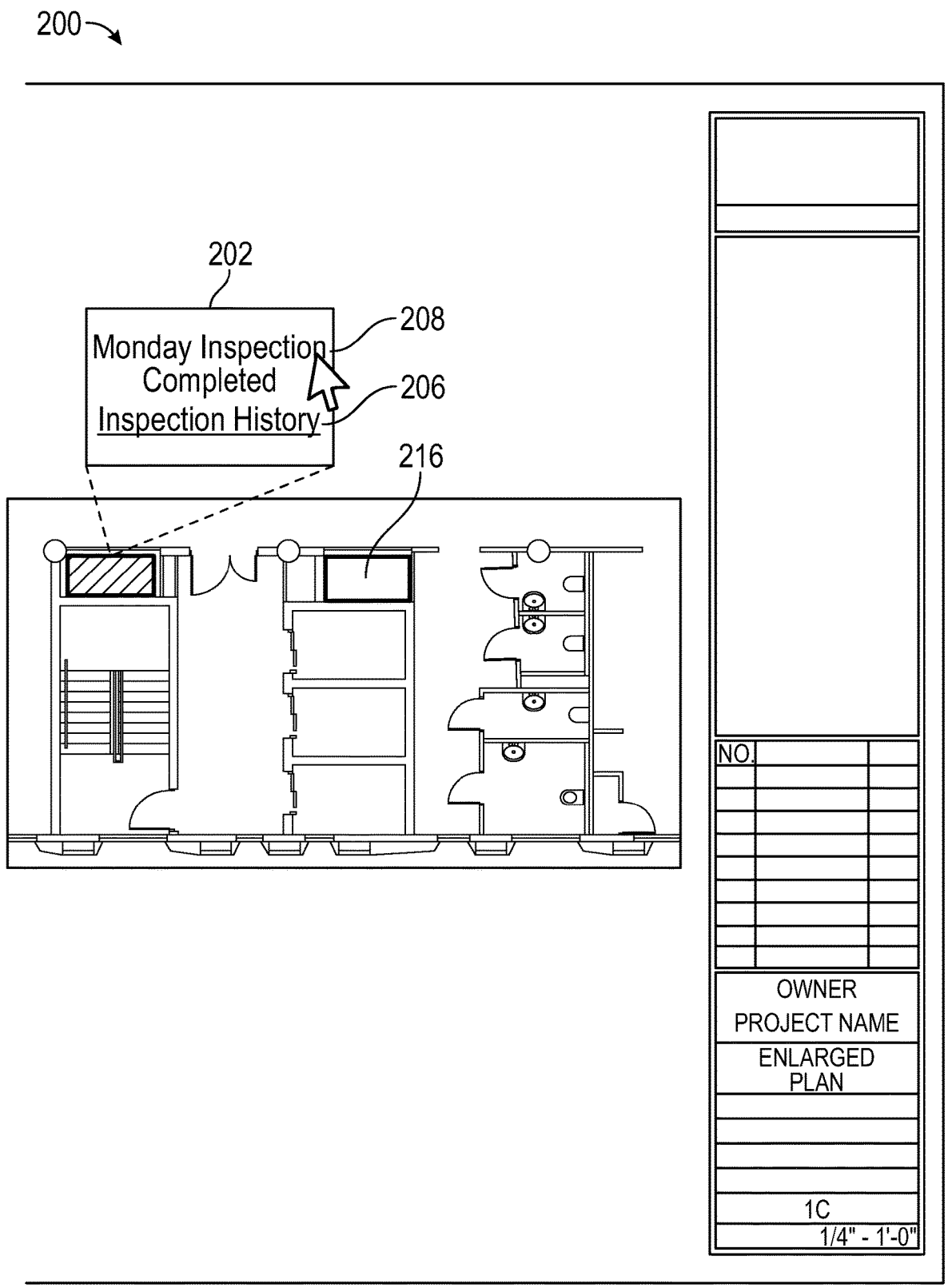
FIG. 2C depicts an exemplary interactive 2-D construction drawing.

FIG. 2C depicts interactive 2-D construction drawing 200 after a field user has provided field generated action data and the field action item has been updated. Specifically, confirmation request 204 has been selected and updated to indicate a completed inspection. In response to receipt of the field generated action data, the field action item in the entity record is updated based on the revised data. This update can occur locally at the remote computer or at a central computer or both, as described elsewhere herein.

As depicted in FIG. 2C, the depiction of affordance 214 has also changed. This modification indicates that a task has been completed. Through updating the entity record, renderings of this construction entity in other 2-D interactive drawings can also be modified to indicate the change in status (see, e.g., affordance 414 on drawing 400). In FIG. 2C, the modification is depicted as a change in fill of the area occupied by the affordance 214, but could also be a change in color, or any visual indication of the change in status.

In some embodiments, the entity record includes at least one of scheduling data and cost data. For example, some methods disclosed herein include cost and schedule information in the entity record or elsewhere in a construction management system. In some further embodiments, once a field user updates a field action item (e.g., by providing field generated action data), the update to the entity record can include updating the cost and schedule information (which includes, in some embodiments, determining the effect of the field generated action data on the cost and schedule of the project), which then can be promulgated to the larger project workflow. Notifications can be sent when field generated action data is inconsistent with a cost or schedule parameter, such as when a field action (as reflected in the field generated action data) results in a cost parameter and/or a schedule parameter to meet a predefined threshold.

In some embodiments, the entity record includes 3-D position data of the construction object corresponding to the digital construction entity. The 3-D position data may be generated by assigning a common base point for all construction objects and using a coordinate system that gives each point (at a given resolution) an identity in 3-D space by reference to the common base point. In one example, Cartesian coordinates (x,y,z) are used with origin (0, 0, 0) as the common base point. This allows the construction objects to be spatially connected, allowing different trades to work together efficiently. For example, a HVAC sub-contractor may reference the construction by "zones," but a painting sub-contractor may reference the project in "rooms;" 3-D position data can link the overlap between the two. Further, the 3-D position data allows field constraints to monitor changes and field action items. For example, if a component (e.g., a wall) is removed, the system will be aware that the removal will affect other components in the construction project (for example, a pipe with 3-D position data within the wall's 3-D position data In some embodiments, the 3-D position data can be used as an entity identifier, or in conjunction with an entity identifier. In some interactive 2-D construction drawings, an affordance of one object may obscure another. For example, rendering a wall in 2-D covers any pipes inside the wall. With 3-D position data of each object, the system can advantageously identify the intersection of two objects, even if one of those objects is not rendered on an interactive 2-D construction drawing. In other embodiments, a free floating pipe (e.g., on an interactive 2-D construction drawing of a plumbing system that does not display other components) can be identified with an associated wall by examining the intersect of the pipe's 3-D position data with other objects (which will include the associated wall).

In some embodiments, the 3-D position data can be used in conjunction with an interactive map. For example, an interactive map of a building may allow a field user to navigate the project (either on-site or remotely), select an object or a view, and then receive an associated interactive 2-D construction drawing for that selection.

Figure 4A:
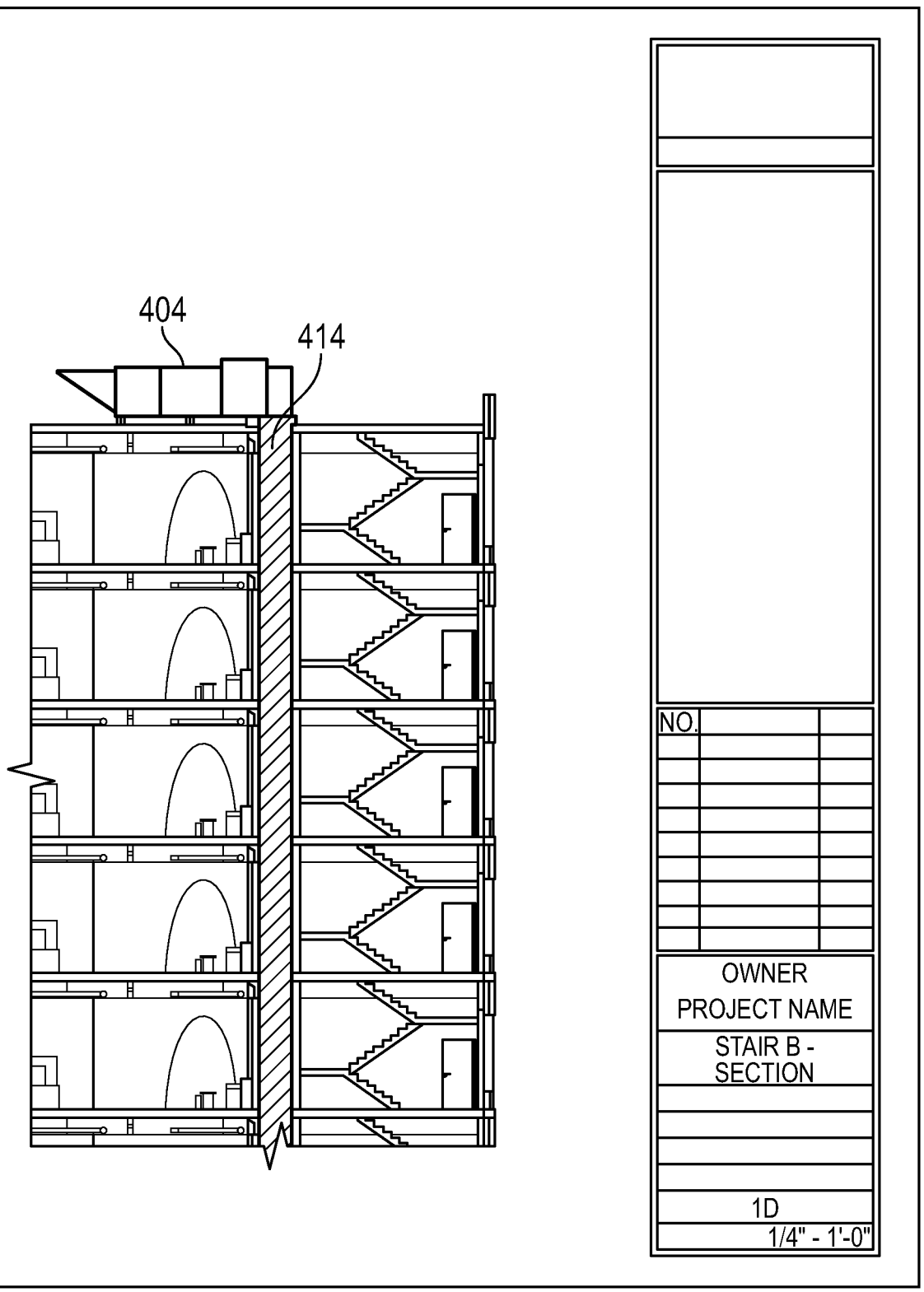
FIG. 4A depicts an exemplary interactive 2-D construction drawing.

FIG. 4A depicts an exemplary interactive 2-D construction drawing 400. Drawing 400 may be a side cutaway view taken through a section of tower 102*b* in model 100. The view depicts physical features of the construction project, including affordance 404 of air handler unit 104 and affordance 414 of exhaust air duct 114 of model 100.

Drawing 400 may be displayed on a second remote computer different from the first remote computer displaying drawing 200. For example, drawing 200 may be requested by and displayed on remote computer 304 in system 300, where drawing 400 is requested by and displayed on remote computer 306 in system 300. Drawings 200 and 400 include different 2-D perspectives of the same air handler unit 104 and exhaust air duct 414 of the 3-D model 100. As with drawing 200, drawing 400 is interactive. In the embodiment of FIG. 4A, the affordances for air handler unit 104 and exhaust air duct 414 are highlighted.

Figure 4B:
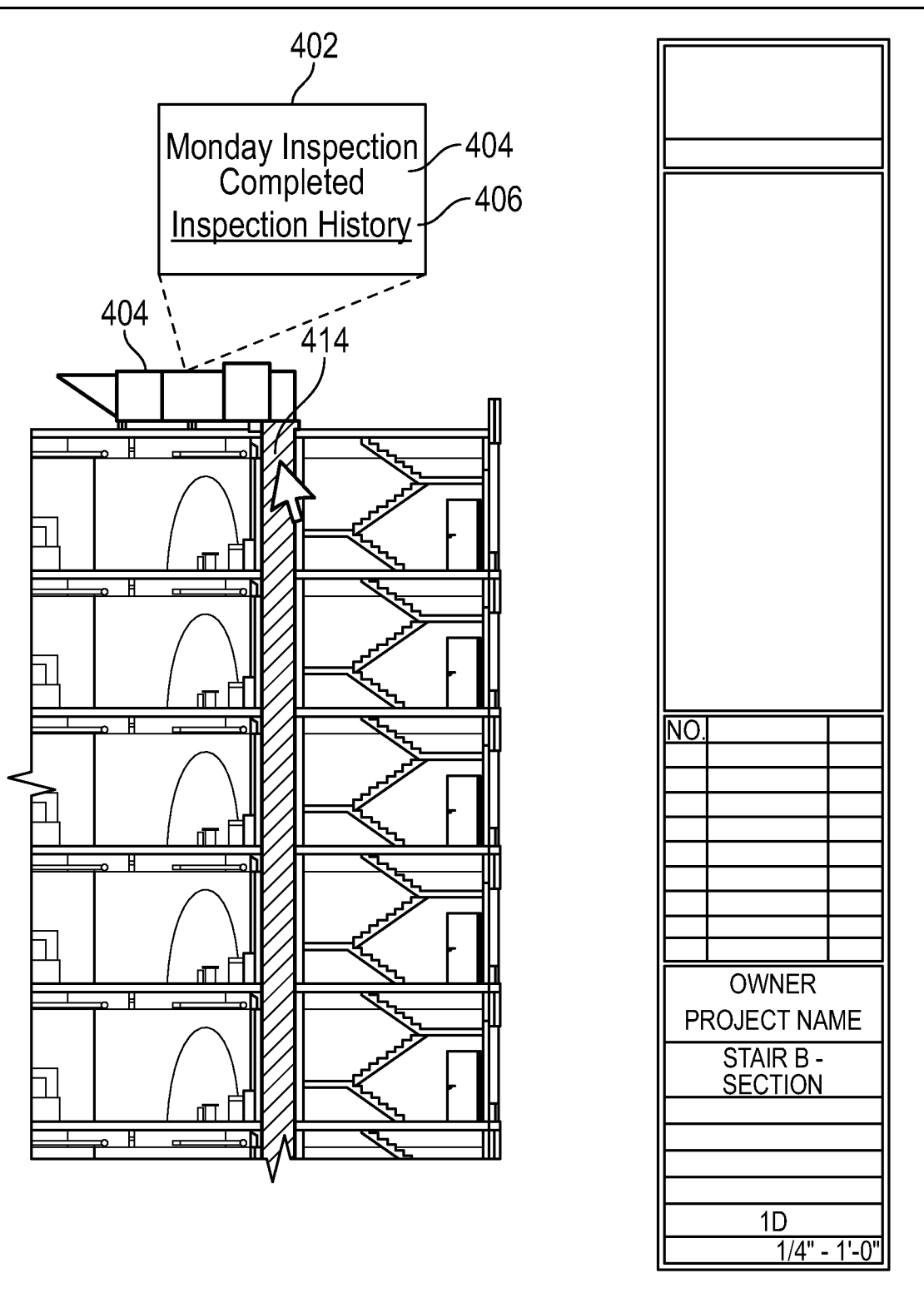
FIG. 4B depicts an exemplary interactive 2-D construction drawing.

As shown in FIGS. 4A and 4B, the depiction of affordance 414 has the same visual characteristic of affordance 214, namely the same fill of the area occupied by the affordance 414. This indicates that a field action item has been completed, as discussed above with respect to FIG. 2C. FIG. 4B depicts drawing 400 after affordance 414 has been selected. The user interface 402 depicts the same field data as user interface 202 after the field data is updated.

In some embodiments, the central computer provides the interactive 2-D construction drawing to the second remote computer, including the updated field action item. In some embodiments, the entity record comprises a list of the plurality of interactive 2-D construction drawings. The central computer may be bypassed (e.g., in a situation where connection to the central computer has been lost) and the first remote computer (i.e., the computer where the field action item was updated) may send the updated field generated action data directly to other remote computers that include an affordance comprising a different 2-D perspective of the same digital construction entity.

Figure 5:
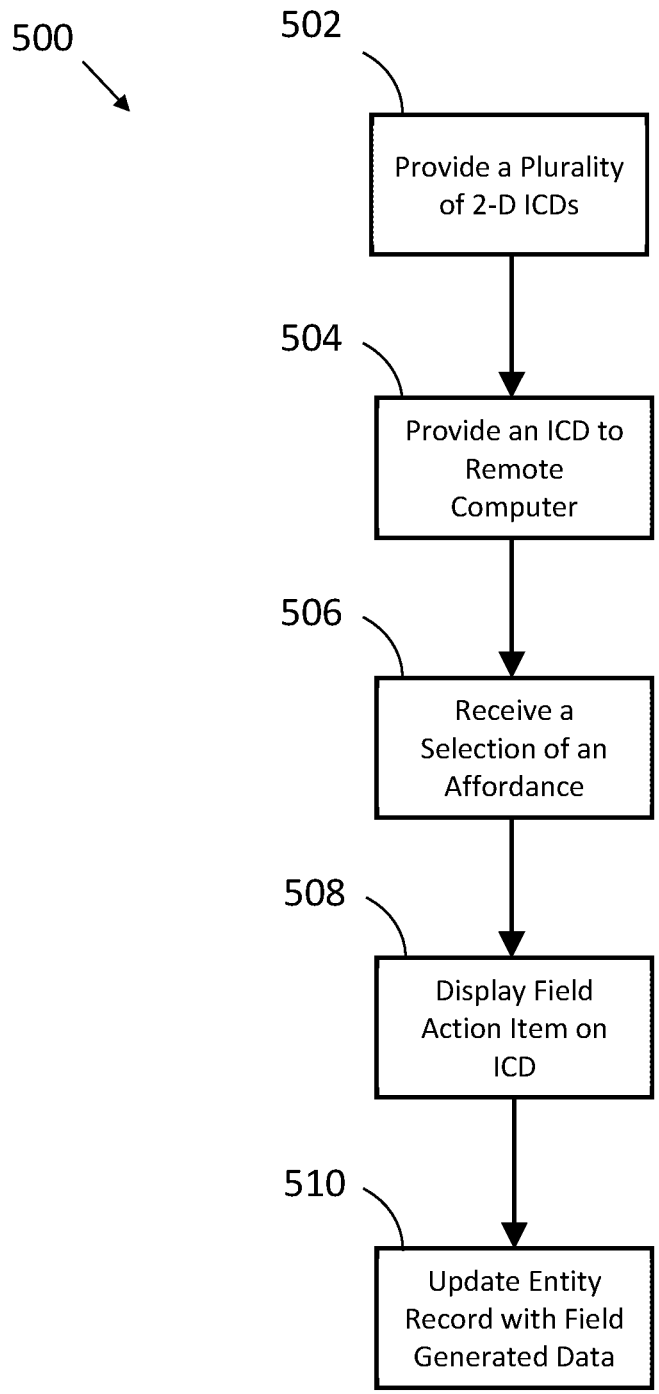
FIG. 5 depicts an exemplary construction management method.

FIG. 5 depicts exemplary construction management method 500. Method 500 may be performed by system 300, including solely on the central server, solely on a remote computer, or some combination of central servers and/or remote computers. Further, method 500 may include any of the interactive 2-D construction drawings or 3-D models described herein, including model 100, drawing 200, and drawing 400.

Method 500 includes providing a plurality of interactive 2-D construction drawings 502. In some embodiments, the drawings are provided on a central computer, such as central server 302. Another step (not shown) in method 500 can include providing a digital construction entity with an entity identifier and an entity record, the entity record including field generated action data. In some embodiments, the interactive 2-D construction drawings each include the entity identifier and a respective affordance corresponding to the digital construction entity, each respective affordance including a different 2-D perspective of the digital construction entity.

In some embodiments, method 500 includes receiving (not shown) a request for one of the plurality of interactive 2-D construction drawings. In some embodiments, the request is received from remote computer 304, 306, 310, 314, or 318.

Method 500 continues with providing the requested interactive 2-D construction drawing to the remote computer 504. The remote computer then displays the requested interactive 2-D construction drawing.

In step 506, method 500 includes receiving a selection of the respective affordance of the requested interactive 2-D construction drawing. In response to receiving the selection of the respective affordance, some embodiments include retrieving a field action item from the entity record and displaying, on the remote computer, the field action item with the requested interactive 2-D construction drawing 208.

In some embodiments, method 500 includes receiving, at the remote computer, field generated action data and updating the field action item in the entity record based on the field generated action data 510.

In some embodiments, method 500 further includes: receiving a request, from a second remote computer, for a different one of the plurality of interactive 2-D construction drawings; providing, to the second remote computer, the second requested interactive 2-D construction drawing; receiving, from the second remote computer, a selection of the respective affordance of the second requested interactive 2-D construction drawing; and in response to receiving the selection of the respective affordance of the second requested interactive 2-D construction drawing: retrieving the updated field action item from the entity record and displaying, on the second remote computer, the updated field action item with the requested interactive 2-D construction drawing.

In some embodiments, the plurality of 2-D construction drawings include the same affordance for the same digital construction entity. In some embodiments, selecting an affordance on one interactive 2-D construction drawing also selects affordances of the same digital construction entity on other interactive 2-D construction entity, including the same affordance and/or different affordances.

In some embodiments, the entity record includes data of previously updated field action items.

In some embodiments, the entity record includes at least one of scheduling data and cost data. In some embodiments, method 500 further includes in response to receiving, at the remote computer, the field generated action data: updating the at least one scheduling data or cost data based on the updated field action item.

In some embodiments, method 500 includes in response to receiving, at the remote computer, the field generated action data: modifying the affordance in each of the plurality of interactive 2-D construction drawings.

In some embodiments, the entity record includes 3-D position data of the digital construction entity.

In some embodiments, updating the field action item in the entity record includes updating the entity record on the central computer.

In some embodiments, the entity record includes a list of the plurality of interactive 2-D construction drawings.

In some embodiments, updating the field action item in the entity record includes: determining that another of the interactive 2-D construction drawings includes an affordance associated with the digital construction entity; providing, to a second remote computer, the updated field action item, wherein the second remote computer locally stores the other of the interactive 2-D construction drawings; and updating a local entity record, stored on the second remote computer, to include the updated field action item.

In some embodiments, method 500 includes revising a rendering of the digital construction entity in a 3-D construction model; determining a modification of the respective affordances based on the revised rendering; and updating the plurality of interactive 2-D construction drawings to include the respective modifications to the affordances.

In some embodiments, method 500 further includes: receiving a new field action item; identifying the digital construction entity in the new field action item; identifying an activity in the new field action item; and updating the entity record to include the activity.

In some embodiments, method 500 further includes identifying a time associated with the activity; and modifying a schedule based on the identified time.

In some embodiments, method 500 includes identifying a cost associated with the activity; and modifying a project cost based on the identified cost.

In some embodiments, providing, to the remote computer, the requested interactive 2-D construction drawing includes authenticating the interactive 2-D construction drawing with a blockchain technology.

Figure 6:
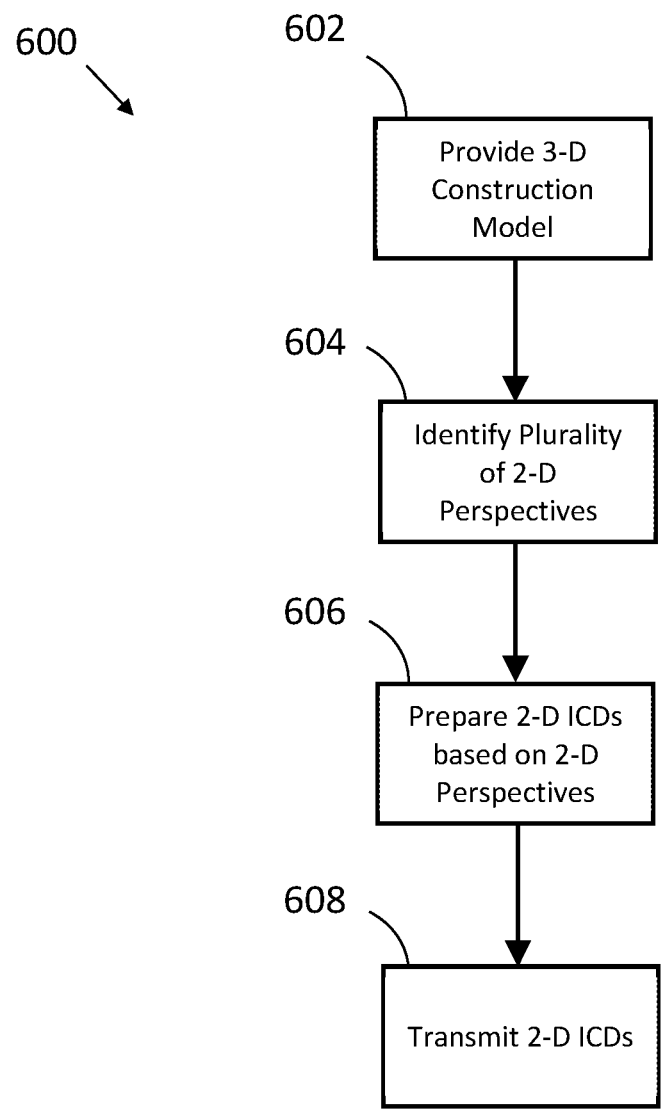
FIG. 6 depicts an exemplary construction management method.

FIG. 6 depicts exemplary method 600. Method 600 may be performed by system 300, including solely on the central server, solely on a remote computer, or some combination of central servers and/or remote computers. Further, method 600 may include any of the interactive 2-D construction drawings or 3-D models described herein, including model 100, drawing 200, and drawing 400. Method 600 may be combined with method 500, and vice-versa.

In some embodiments, method 600 results in a plurality of interactive 2-D construction drawings. Method 600 includes providing a 3-D construction model with a digital construction entity 602. The method can include receiving a plurality of viewpoints of the digital construction entity, each corresponding to a respective one of the different 2-D perspective of the digital construction entity (not shown). Step 604 includes identifying a plurality of 2-D perspectives of the 3-D construction model, each including a respective one of the plurality of 2-D perspectives of the digital construction entity. Step 606 includes preparing the plurality of interactive 2-D construction drawings based on the plurality of 2-D perspectives of the 3-D construction model. In step 608, method 600 transmits the plurality of interactive 2-D construction drawings.

Some methods further include, for each viewpoint: identifying a border of the digital construction entity for the respective viewpoint; identifying an area of the digital construction entity for the respective viewpoint based on the identified border; identifying the affordance of the digital construction entity based on the identified area; and associating the entity identifier with the affordance. Such a method may be integrated into, used in conjunction with, or separate from method 500, method 600, or any other method.

Figure 7A:
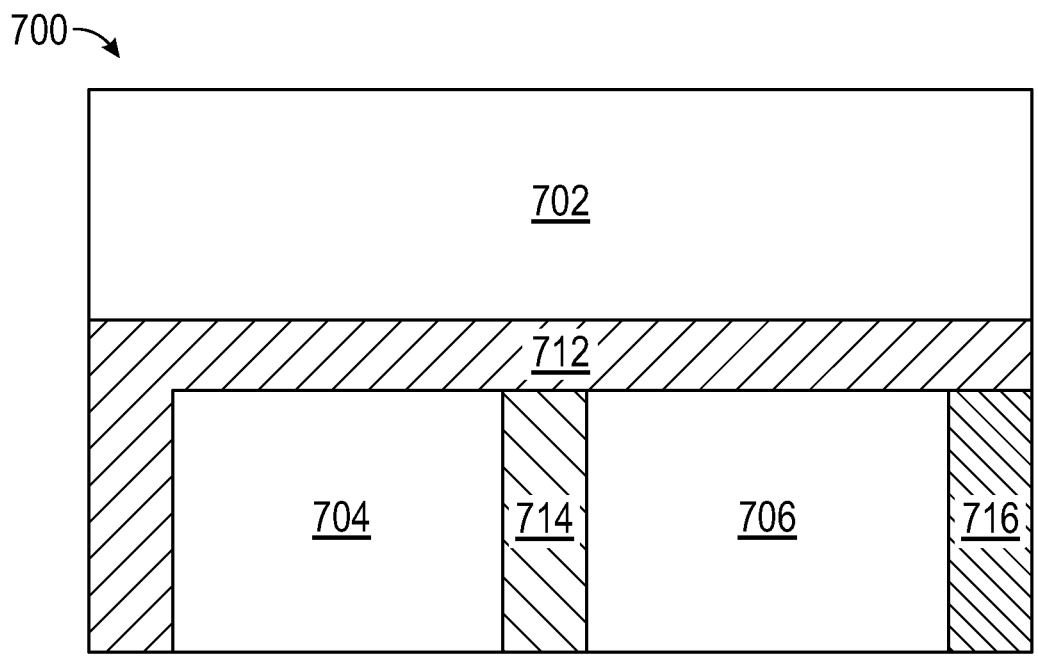
FIG. 7A depicts an exemplary 3-D to 2-D conversion.

FIG. 7A illustrates an exemplary 3-D to 2-D conversion, as may be performed by an embodiment of method 600. Layout 700 is 2-D view taken of a 3-D model. As discussed with respect to method 600, embodiments herein include identifying the area of a digital construction. In layout 700, the method identified areas associated with Rooms 702, 704, and 706 and Walls 712, 714, and 716. Each of these areas can be associated with affordances of the corresponding digital construction entity in an interactive 2-D construction drawing. As shown in layout 700, Wall 712 has an L-shape and (1) separates Rooms 702 from Rooms 704 and 706 and (2) separates Room 704 from the exterior. Wall 714 has a rectangular shape and separates Rooms 704 and 706. Wall 716 is also rectangular and separates Rooms 706 from an exterior.

Figure 7B:
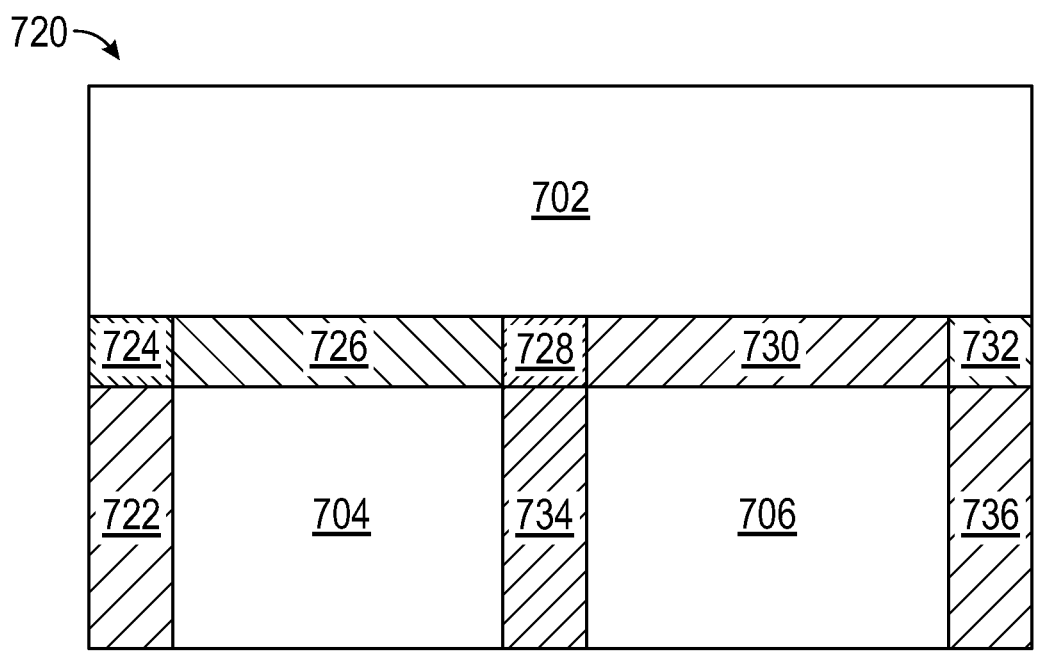
FIG. 7B depicts an exemplary 3-D to 2-D conversion.

In some methods, an area of a digital construction entity may be further divided in sub-areas. In some embodiments, these areas are identified, in part, based on the perspectives of the 2-D interactive construction drawings and/or 3-D position data of objects or potential real world perspectives. FIG. 7B depicts layout 720 to illustrate this example. Layout 720 represents the same physical structure as represented in layout 700, with the areas of the digital construction entities subdivided. These subdivided areas may be independently identified/tracked and/or associated with the associated entity identifier.

For example, in layout 720, Wall 712 (of layout 700) has been subdivided into 6 sub-walls, 722, 724, 726, 728, 730, and 732. Sub-dividing the wall may advantageously limit associated field action items and associated data to a portion of an object associated with a particular perspective. To illustrate, consider a field user standing in Room 704 and considering Wall 712 (of layout 700). That user is only concerned with sub-walls 722 and 726 and is not concerned with, for example, wall 730. Thus, if the field user selects an affordance of Wall 712 on an interactive 2-D construction drawing with a perspective from inside Room 704, that user may not be unconcerned with a scheduling delay (for example) affecting sub-wall 730. Instead, the field user is concerned with scheduling delays affecting sub-walls 722 and 726 (and wall 734). By sub-dividing a construction object, an affordance associated with a construction object (such as Wall 712) can be more specifically associated with a relevant portion of that object (such as sub-wall 722).

The sub-areas can be associated with Wall 712 using 3-D position data (described elsewhere herein). Further, the 3-D position data can be used with a field user's current location to determine which sub-areas are relevant to the field user at the time the field user interacts with Wall 712. For example, when a field user navigates via an interactive map.

In some embodiments, a 3-D model is converted to 2-D drawings or grids having any of a variety of levels of information and detail. The 2-D drawings or grids are flat views or representations of aspect views of the 3-D model. Each of the 2-D drawings or grids is linked to the 3-D model in a pre-set, predictable, or traceable manner such as using an identification indicium such as an object ID. A tracing algorithm is utilized to convert the 3-D model to an interactive 3-D BIM (interactive BIM) and/or interactive 2-D drawings or grids, including a predetermined level of information and detail. Within each interactive 3-D BIM are actuatable objects that render the BIM interactive (interactive BIM). Each of the 2-D drawings or grids are assigned to or comprise a construction sheet that is or is reminiscent of a building construction blueprint used for construction project planning, permitting and building. Within each 2-D drawing or grid are actuatable objects that render the 2-D drawing or grid interactive (interactive 2-D construction drawings). In this regard, a person viewing the 2-D drawing or grid can select the object within the grid to obtain information about or related to that object, or an area or section of the 3-D model.

In some embodiments, a method includes authenticating the interactive 2-D construction drawing with a blockchain technology. By timestamping and locking the 3-D model, embodiments herein may advantageously validate its version. The locked 3-D model can then be used to generate the interactive 2-D construction drawings and authenticate those drawings using the validated 3-D model.

As used herein, "blockchain" or "blockchain technology" can be understood to include data management technology, in which data is recorded in certain units of block and nodes of a peer-to-peer (P2P) network managing the blocks in a chain-form data structure, or refers to data itself of the chain-form data structure. Blockchain data of the chain-form data structure is often managed in the form of a distributed ledger at each individual node, without a central system. In this regard, blockchain, includes any of such electronic, computer-based, distributed ledgers regardless of the chosen authentication technology or process.

Authentication (such as using blockchain) can advantageously effect timing for resolving RFIs. Since each interactive 2-D construction drawings includes a respective affordance associated with the same digital construction entity, any of the drawings could be an approved/permitted blueprint. When that 2-D construction drawing is changed based on a field action item that results in a RFI that is subsequently resolved, the RFI change can be updated with the authenticated digital construction entity. The RFI-mandated change to one interactive 2-D construction drawing is reflected and automatically authenticated in each of the other 2-D construction drawings that include an affordance for the respective digital construction entity (including their respective field action items) because of synching and authenticating with the digital construction entity.

In some embodiments, the construction method is cloud-hosted and viewable on any mobile or non-mobile communication or computing device. Each of the interactive 2-D construction drawings is linked to an interactive 3-D model in a pre-set, predictable, or traceable manner such as using an identification indicia as described herein. The information about or related to the interactive 2-D construction drawings or interactive 3-D model is synched in the system such that when a record is created or changed comprising or related to this information in the field, the data comprised in the interactive 2-D construction drawings and/or interactive 3-D model are updated with this information. In this regard, a viewer or user of the interactive 2-D construction drawings may have or be granted authorship rights to alter or update this information to permit the synching thereof. Such authorship rights may be moderated such that non-authorship viewing rights may be available to certain users, and authorship viewing rights may be provided to other users. The associated rights may vary based on the specific interactive 2-D construction drawing, between interactive 2-D construction drawings, and the interactive 3-D model, or another parsing of rights.

In some embodiments, a method includes providing new field action items and updating the field generated action data. In such embodiments, the method includes receiving a new field action item and identifying the digital construction entity in the new field action item. The method proceeds with identifying an activity in the new field action item and updating the entity record to include the activity. For example, if a scheduling order including "Inspection of Room 4B on Monday at 3 pm," the method identifies a field action item (inspection) of a construction entity with an entity identifier (Room 4B). The field generated action data is then updated in the entity record to include the action and entity identifier. In further embodiments, the time associated with the activity (Monday at 3 pm) is identified and a project schedule is modified based on the identified time. In some embodiments, a cost associated with the activity is identified and a budget is modified based on the identified cost.

In some embodiments, updating the project with the new activity triggers an alert. One exemplary alert is a scheduling alert created based on the updated field action item (e.g., by analyzing field generated action data) that causes an RFI related to an installation of equipment or a construction aspect or planning thereof. When an RFI is triggered, active construction on aspects related to the RFI will be placed under hold until the RFI is resolved. Under such an RFI alert, therefore, the system often provides a scheduling alert to permit a contractor or subcontractor to adjust scheduling of personnel and/or equipment used in the planning or construction aspects related to the RFI. This alert permits adjustments to such scheduling as quickly as possible to avoid incurring avoidable costs associated with delays in communicating and resolving RFIs.

In some embodiments, the actuatable records underlying the interactive model and/or interactive construction sheet are predictive and automatically generate a preventative measures report on upcoming activities that contain a similar construction sheet or model object having open/closed constraint records. Machine learning and artificial intelligence algorithms may be utilized in preparing and adapting the type, order, timing and/or speed of such prediction and/or preventative measures reports based on one or more standard or preference data inputs.

In a first method embodiment, a construction management method comprises: providing a digital construction entity comprising an entity identifier and an entity record, the entity record comprising field generated action data; providing, at a central computer, a plurality of interactive two-dimensional (2-D) construction drawings, each comprising the entity identifier and a respective affordance corresponding to the digital construction entity, wherein each respective affordance comprises a different 2-D perspective of the digital construction entity; receiving, from a remote computer, a request for one of the plurality of interactive 2-D construction drawings; providing, to the remote computer, the requested interactive 2-D construction drawing; displaying, on the remote computer, the requested interactive 2-D construction drawing; receiving a selection of the respective affordance of the requested interactive 2-D construction drawing; in response to receiving the selection of the respective affordance: retrieving a field action item from the entity record; and displaying, on the remote computer, the field action item with the requested interactive 2-D construction drawing; receiving, at the remote computer, field generated action data; and updating the field action item in the entity record based on the field generated action data.

In a second method embodiment, the first method embodiment further comprising: receiving a request, from a second remote computer, for a different one of the plurality of interactive 2-D construction drawings; providing, to the second remote computer, the second requested interactive 2-D construction drawing; receiving, from the second remote computer, a selection of the respective affordance of the second requested interactive 2-D construction drawing; and in response to receiving the selection of the respective affordance of the second requested interactive 2-D construction drawing: retrieving the updated field action item from the entity record; and displaying, on the second remote computer, the updated field action item with the requested interactive 2-D construction drawing.

In a third method embodiment, any of the first or second method embodiment, wherein the entity record comprises data of previously updated field action items.

In a fourth method embodiment, any of the first through third method embodiments, wherein the entity record comprises at least one of scheduling data and cost data.

In a fifth method embodiment, the method of the fourth method embodiment further comprising in response to receiving, at the remote computer, the field generated action data: updating the at least one scheduling data or cost data based on the updated field action item.

In a sixth method embodiment, any of the first through fifth method embodiments, wherein in response to receiving, at the remote computer, the field generated action data: modifying the affordance in each of the plurality of interactive 2-D construction drawings.

In a seventh method embodiment, any of the first through sixth method embodiments, wherein the entity record comprises three-dimensional (3-D) position data of the digital construction entity.

In an eighth method embodiment, any of the first through seventh method embodiments, wherein updating the field action item in the entity record comprises updating the entity record on the central computer.

In a ninth method embodiment, any of the first through eight method embodiments, wherein the entity record comprises a list of the plurality of interactive 2-D construction drawings.

In a tenth method embodiment, any of the first through ninth method embodiments, wherein updating the field action item in the entity record comprises: determining that another of the interactive 2-D construction drawings includes an affordance associated with the digital construction entity; providing, to a second remote computer, the updated field action item, wherein the second remote computer locally stores the other of the interactive 2-D construction drawings; and updating a local entity record, stored on the second remote computer, to include the updated field action item.

In an eleventh method embodiment, any of the first through tenth method embodiments, wherein providing a plurality of interactive 2-D construction drawings comprises: providing a 3-D construction model comprising the digital construction entity; receiving a plurality of viewpoints of the digital construction entity, each corresponding to a respective one of the different 2-D perspective of the digital construction entity; identifying a plurality of 2-D perspectives of the 3-D construction model, each comprising a respective one of the plurality of 2-D perspectives of the digital construction entity; preparing the plurality of interactive 2-D construction drawings based on the plurality of 2-D perspectives of the 3-D construction model; and transmitting the plurality of interactive 2-D construction drawings.

In a twelfth method embodiment, the eleventh method embodiment, wherein preparing the plurality of interactive 2-D construction drawings comprises, for each viewpoint: identifying a border of the digital construction entity for the respective viewpoint; identifying an area of the digital construction entity for the respective viewpoint based on the identified border; identifying the affordance of the digital construction entity based on the identified area; and associating the entity identifier with the affordance.

In a thirteenth method embodiment, the twelfth embodiment, wherein identifying the area of the digital construction entity for the respective viewpoint based on the identified border includes identifying sub-areas of the digital construction entity and wherein identifying the affordance of the digital construction entity based on the identified area comprises identifying the affordance of the digital construction entity based on an identified sub-area of the wall.

In a fourteenth method embodiment, any of the first through thirteenth method embodiments, further comprising: revising a rendering of the digital construction entity in a 3-D construction model; determining a modification of the respective affordances based on the revised rendering; and updating the plurality of interactive 2-D construction drawings to include the respective modifications to the affordances.

In a fifteenth method embodiment, any of the first through fourteenth method embodiments, further comprising: receiving a new field action item; identifying the digital construction entity in the new field action item; identifying an activity in the new field action item; and updating the entity record to include the activity.

In a sixteenth method embodiment, any of the first through fifteenth method embodiments, further comprising: identifying a time associated with the activity; and modifying a schedule based on the identified time.

In a seventeenth method embodiment, any of the fifteenth or sixteenth method embodiments, identifying a cost associated with the activity; and modifying a project cost based on the identified cost.

In an eighteenth method embodiment, any of the first through seventeenth method embodiments, wherein providing, to the remote computer, the requested interactive 2-D construction drawing comprises authenticating the interactive 2-D construction drawing with a blockchain technology.

An electronic device, comprising: a processor; memory; and a program, wherein the program is stored in the memory and configured to be executed by the processor, the program including instructions for performing any of the methods of the first through eighteenth method embodiments above.

In some embodiments, a process for requesting and implementing a request for information (RFI) in a construction project that is the subject of a permit, comprises: identifying a change that is required in a construction drawing, the construction drawing being representative of a view of the construction project; accessing a 3-D model that comprises the view of the construction project using a blockchain technology; selecting a portion of the accessed 3-D model that comprises the view; editing the selected portion in a manner that incorporates the change; issuing a revised construction drawing comprising the construction drawing having the change; and creating a log comprising data memorializing information related to the change.

In some embodiments of the process, the portion is selected by selecting a shape on the 3-D dimensional model comprising a sheet callout link, which sheet callout link is operably connected to a nested menu.

In some embodiments of the process, the nested menu comprises one or more sub-selectable menu items comprised in a reference list.

In some embodiments, a digital construction drawing (DCD), comprises: computer executable DCD data representative of a traditional construction drawing electronically stored in a tangible storage medium, wherein the traditional construction drawing comprises a single view of a portion of a 3-D model; computer executable data representative of the 3-D model, wherein the computer executable data representative of the 3-D model is accessed by a user and authenticated using a blockchain technology; and the computer executable DCD data representative of the traditional construction drawing being electronically linked to the computer executable data representative of the 3-D model such that a manipulation of the data representative of the 3-D model in an aspect concerning the single view causes a corresponding manipulation of the computer executable DCD data representative of the traditional construction, wherein the blockchain technology is utilized to provide access to the manipulation of the data representative of the 3-D model.

As used herein, "computer executable" includes instructions and data which, when executed at one or more processors, cause a general-purpose computing system, special-purpose computing system, or special-purpose processing device to perform a certain function or group of functions. Computer-executable instructions may be, for example, binaries, intermediate format instructions such as assembly language, or even source code. Computer-executable instructions, therefore, include any software, including low level software written in machine code, higher level software such as application software and any combination thereof. In this regard, the system components can manage resources and provide services for the system functionality. Any other variations and combinations thereof are contemplated with embodiments of the present disclosure.

In some embodiments, an interactive and adaptive BIM (or other 3-D information model) for real-time use in managing a project comprises a plurality of modules: a design module comprising a 3-D model operably connected with a plurality of 2-D drawings, wherein the plurality of 2-D drawings are representative of the 3-D model; a jurisdiction module comprising a plurality of digitally authenticated drawings, each of the plurality of digitally authenticated drawings being operably connected with the 3-D model; an owner module comprising a project schedule or a project budget; and a contractor module comprising a project inventory or a project field constraint, wherein each of the plurality of modules being operably connected with one-another such that altering a variable in one module of the plurality of modules will affect, without additional input, a variable in at least one other module of the plurality of modules.

In some embodiments of the interactive and adaptive BIM, the 3-D model or jurisdiction module comprises a plurality of actuatable subproject variables, each of the plurality of actuatable subproject variables having a jurisdiction module comprising approved drawings related to the subproject variable and operably connected with the 3-D model or 2-D drawings; an owner module comprising a schedule related to the subproject or a budget related to the subproject; and a contractor module comprising an inventory or a field constraint.

In some embodiments of the interactive and adaptive BIM, the 3-D model and the 2-D drawings each comprise a plurality of visible lines representative of a physical element of the project, and wherein each of the plurality of visible lines comprises an actuatable subproject variable, each of the actuatable subproject variable including a jurisdiction module comprising approved drawings depicting the visible line and operably connected with the 3-D model or 2-D drawings; an owner module comprising a schedule related to the physical element of the project or a budget related to the physical element of the project; and a contractor module comprising an inventory related to the physical element of the project or a field constraint related to the physical element of the project.

In some embodiments of the interactive and adaptive BIM, the operable connection between elements within each of the plurality of modules or between two or more of the plurality of modules comprises an electronic actuatable, data transmission, editable, secure, recordable, permanent, or reversible connection, or a combination of two or more of such connections.

As used herein, "operably connected" refers to two or more components, such as two or more modules, are directly or indirectly connected to permit or perform a function for which at least one of the components/modules is specified.

In some embodiments of the interactive and adaptive BIM, the 3-D model is digitally authenticated.

In some embodiments, the interactive and adaptive BIM further comprises a user interface, wherein the user interface is adapted to view, edit and/or print one or more of the design module, the jurisdiction module, the owner module, or the contractor module.

In some embodiments, a digital construction entity includes an entity identifier and an entity record. In some embodiments, the entity record includes field action items. In some embodiments, the field action items includes a time associated with the action. In some embodiments, the entity record includes field generated action data. In some embodiments, the entity record includes data of previously updated field action items. In some embodiments, the entity record includes scheduling data. In some embodiments, the entity record includes cost data. In some embodiments, the entity record includes 3-D position data of the digital construction entity. In some embodiments, the entity record includes a list of a plurality of interactive 2-D construction drawings which includes affordances of the digital construction entity. In some embodiments, the digital construction entity includes other relevant information. In some embodiments, the digital construction entity includes a combination of two or more of any of the foregoing.

Numerous modifications may be made to the foregoing systems without departing from the basic teachings thereof. Although the present invention has been described in substantial detail with reference to one or more specific embodiments, those of skill in the art will recognize that changes may be made to the embodiments specifically disclosed in this application, yet these modifications and improvements are within the scope and spirit of the invention, as set forth in the claims which follow.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A construction management method comprising:
providing a three-dimensional (3-D) construction model comprising a digital construction entity;
providing the digital construction entity comprising an entity identifier and an entity record, the entity record comprising field action items and 3-D position data of the 3-D construction model;
providing a plurality of interactive two-dimensional (2-D) construction drawings, each comprising the entity identifier, a respective affordance corresponding to the digital construction entity, and respective position data, wherein each respective affordance comprises a different 2-D perspective of the digital construction entity;
receiving, from a remote computer, a request for one of the plurality of interactive 2-D construction drawings;
providing, to the remote computer, the requested interactive 2-D construction drawing, wherein the remote computer is configured to display the requested interactive 2-D construction drawing;
receiving a selection of the respective affordance of the requested interactive 2-D construction drawing;
in response to receiving the selection of the respective affordance:
retrieving a field action item from the entity record, wherein the remote computer is configured to display the field action item with the requested interactive 2-D construction drawing;
receiving field generated action data, wherein:
the field generated action data is received in real-time in accordance with a determination that the remote computer is connected to a network, and
the field generated action data was stored in the remote computer in accordance with a determination that the remote computer was not connected to the network;
in response to receiving the field generated action data, modifying the affordance in each of the plurality of interactive 2-D construction drawings;
updating the entity record based on the field generated action data;
in response to updating the entity record based on the field generated action data, updating the 3-D position data of the 3-D construction model;
revising a rendering of the digital construction entity in the 3-D construction model, wherein revising the rendering of the digital construction entity in the 3-D construction model comprises revising the 3-D position data of the 3-D construction model;
determining a modification of the respective affordances based on the revised rendering;
determining a modification of the respective position data based on the revised rendering; and
updating the plurality of interactive 2-D construction drawings to include the respective modifications to the affordances and the respective modifications to the position data.

2. The method of claim 1, further comprising:
receiving a request, from a second remote computer, for a different one of the plurality of interactive 2-D construction drawings;
providing, to the second remote computer, the second requested interactive 2-D construction drawing;
receiving, from the second remote computer, a selection of the respective affordance of the second requested interactive 2-D construction drawing; and
in response to receiving the selection of the respective affordance of the second requested interactive 2-D construction drawing:
retrieving the updated field action item from the entity record; and
displaying, on the second remote computer, the updated field action item with the requested interactive 2-D construction drawing.

3. The method of claim 1, wherein the entity record comprises data of previously updated field action items.

4. The method of claim 1, wherein the entity record comprises at least one of scheduling data and cost data.

5. The method of claim 4, the method further comprising in response to receiving, at the remote computer, the field generated action data:
updating the at least one scheduling data or cost data based on the updated field action item.

6. The method of claim 1, wherein updating the entity record comprises updating the entity record on a central computer.

7. The method of claim 1, wherein the entity record comprises a list of the plurality of interactive 2-D construction drawings.

8. The method of claim 1, wherein updating item in the entity record comprises:
determining that another of the interactive 2-D construction drawings includes an affordance associated with the digital construction entity;
providing, to a second remote computer, an updated field action item, wherein the second remote computer locally stores the other of the interactive 2-D construction drawings; and
updating a local entity record, stored on the second remote computer, to include the updated field action item.

9. The method of claim 1, wherein providing a plurality of interactive 2-D construction drawings comprises:
receiving a plurality of viewpoints of the digital construction entity, each corresponding to a respective one of the different 2-D perspective of the digital construction entity;
identifying a plurality of 2-D perspectives of the 3-D construction model, each comprising a respective one of the plurality of 2-D perspectives of the digital construction entity;
preparing the plurality of interactive 2-D construction drawings based on the plurality of 2-D perspectives of the 3-D construction model; and
transmitting the plurality of interactive 2-D construction drawings.

10. The method of claim 1, wherein preparing the plurality of interactive 2-D construction drawings comprises, for each viewpoint:
identifying a border of the digital construction entity for the respective viewpoint;
identifying an area of the digital construction entity for the respective viewpoint based on the identified border;
identifying the affordance of the digital construction entity based on the identified area; and
associating the entity identifier with the affordance.

11. The method of claim 10, wherein identifying the area of the digital construction entity for the respective viewpoint based on the identified border comprises identifying sub-areas of the digital construction entity and wherein
identifying the affordance of the digital construction entity based on the identified area comprises identifying the affordance of the digital construction entity based on an identified sub-area of the wall.

12. The method of claim 1, further comprising:
receiving a new field action item;
identifying the digital construction entity in the new field action item;
identifying an activity in the new field action item; and
updating the entity record to include the activity.

13. The method of claim 12, further comprising:
identifying a time associated with the activity; and
modifying a schedule based on the identified time.

14. The method of claim 12, further comprising:
identifying a cost associated with the activity; and
modifying a project cost based on the identified cost.

15. The method of claim 1, wherein providing, to the remote computer, the requested interactive 2-D construction drawing comprises authenticating the interactive 2-D construction drawing with a blockchain technology.

16. An electronic device, comprising:
a processor;
memory; and
a program, wherein the program is stored in the memory and configured to be executed by the processor, the program comprising instructions for:
providing a three-dimensional (3-D) construction model comprising a digital construction entity;
providing the digital construction entity comprising an entity identifier and an entity record, the entity record comprising field generated action data and 3-D position data of the 3-D construction model;
providing a plurality of interactive 2-D construction drawings, each comprising the entity identifier, a respective affordance corresponding to the digital construction entity, and respective position data, wherein each respective affordance comprises a different 2-D perspective of the digital construction entity;
receiving, from a remote device, a request for one of the plurality of interactive 2-D construction drawings;
providing, to the remote device, the requested interactive 2-D construction drawing;
receiving, form the remote device, a selection of the respective affordance of the requested interactive 2-D construction drawing;
in response to receiving the selection of the respective affordance:
retrieving a field action item from the entity record; and
transmitting, to the remote computer, the field action item with the requested interactive 2-D construction drawing;
receiving, from the remote computer, field generated action data, wherein:
the field generated action data is received in real-time in accordance with a determination that the remote computer is connected to a network, and
the field generated action data was stored in the remote computer in accordance with a determination that the remote computer was not connected to the network;
in response to receiving the field generated action data, modifying the affordance in each of the plurality of interactive 2-D construction drawings;
updating the entity record based on the field generated action data;
in response to updating the entity record based on the field generated action data, updating the 3-D position data of the 3-D construction model;
revising a rendering of the digital construction entity in the 3-D construction model, wherein revising the rendering of the digital construction entity in the 3-D construction model comprises revising the 3-D position data of the 3-D construction model;
determining a modification of the respective affordances based on the revised rendering;
determining a modification of the respective position data based on the revised rendering; and updating the plurality of interactive 2-D construction drawings to include the respective modifications to the affordances and the respective modifications to the position data.

17. The electronic device of claim 16, wherein the program further comprises instructions for:
receiving a request, from a second remote computer, for a different one of the plurality of interactive 2-D construction drawings;
providing, to the second remote computer, the second requested interactive 2-D construction drawing;
receiving, from the second remote computer, a selection of the respective affordance of the second requested interactive 2-D construction drawing; and
in response to receiving the selection of the respective affordance of the second requested interactive 2-D construction drawing:
retrieving the updated field action item from the entity record; and
transmitting, to the second remote computer, the updated field action item with the requested interactive 2-D construction drawing.

\* \* \* \* \*